United States Patent
Lee

(10) Patent No.: US 8,438,458 B2
(45) Date of Patent: May 7, 2013

(54) DECODER AND APPARATUSES INCLUDING THE SAME

(75) Inventor: Joo Hyun Lee, Yongin-si (KR)

(73) Assignee: Seagate Technology International, LLC, Grand Cayman (KY)

(*) Notice: Subject to any disclaimer, the term of this patent is extended or adjusted under 35 U.S.C. 154(b) by 251 days.

(21) Appl. No.: 13/038,636

(22) Filed: Mar. 2, 2011

(65) Prior Publication Data

US 2011/0219282 A1 Sep. 8, 2011

(30) Foreign Application Priority Data

Mar. 2, 2010 (KR) .................. 10-2010-0018652

(51) Int. Cl.
 *H03M 13/00* (2006.01)
(52) U.S. Cl.
 USPC .......................... 714/774; 715/755

(58) Field of Classification Search .................. 714/774, 714/755

See application file for complete search history.

(56) References Cited

U.S. PATENT DOCUMENTS

| | | | | |
|---|---|---|---|---|
| 7,000,168 | B2* | 2/2006 | Kurtas et al. | 714/755 |
| 7,502,982 | B2* | 3/2009 | Silvus et al. | 714/753 |
| 2009/0327832 | A1* | 12/2009 | Ichihara | 714/752 |
| 2010/0192040 | A1* | 7/2010 | Yedidia et al. | 714/755 |

* cited by examiner

*Primary Examiner* — M. Mujtaba K Chaudry

(57) ABSTRACT

A decoder includes a first decoder configured to iteratively decode input data, accumulate iteratively decoded data in bit units, compare an accumulated value obtained for each bit of the iteratively decoded data with a plurality of reference values, and output decision data and indicator data according to a comparison result. The decoder includes a second decoder configured to perform error correction on a symbol including the decision data according to the indicator data.

18 Claims, 10 Drawing Sheets

FIG. 3

| Procedure | Iterative Decoder Outputs | Accumulator Outputs |
|---|---|---|
| N-th | 1 0 1 1 0 1 0 0 1 ... 1 1 1 0 1 0 0 0 | 1 0 1 1 0 0 1 ... 1 1 1 0 0 0 |
| [N+1]-th | 1 0 1 1 0 0 1 0 1 ... 1 1 1 0 1 0 0 0 | 2 0 2 2 0 0 2 ... 2 2 2 0 0 0 |
| [N+2]-th | 1 0 1 1 0 1 1 0 1 ... 1 1 1 0 1 0 0 0 | 3 0 3 3 1 2 3 ... 3 3 2 0 0 0 |
| [N+3]-th | ... | ... |
| ... | ... | ... |
| [N+K−1]-th | 1 1 1 0 0 1 1 0 1 ... 1 1 1 0 0 1 0 0 | K O K A O B K ... K K C O K O |

DECODER AND APPARATUSES INCLUDING THE SAME

CROSS-REFERENCE TO RELATED APPLICATIONS

This application claims the benefit of priority under 35 U.S.C. §119 to Korean Patent Application No. 10-2010-0018652 filed on Mar. 2, 2010, the disclosure of which is hereby incorporated by reference in its entirety.

BACKGROUND

1. Field of the Invention

The present general inventive concept relates to a decoder, and more particularly, to a decoder with an improved bit error rate (BER) and apparatuses including the same.

2. Description of the Related Art

Iterative decoders perform iterative decoding on input data for a default number of iterations and transmit data resulting from iterative decoding to a Reed-Solomon (RS) error correction code (ECC) decoder. The RS ECC decoder performs error correction on the decoded data from an iterative decoder.

SUMMARY

Embodiments of the present general inventive concept provide a decoder for estimating decoded data in bit units using an accumulator and correcting an error using information about a symbol having the error and apparatuses including the decoder.

Additional aspects and utilities of the present general inventive concept will be set forth in part in the description which follows and, in part, will be obvious from the description, or may be learned by practice of the present general inventive concept.

Features and/or utilities of the present general inventive concept may be realized by a decoder including a first decoder configured to iteratively decode input data, accumulate iteratively decoded data in bit units, compare an accumulated value obtained for each bit of the iteratively decoded data with a plurality of reference values, and output decision data and indicator data according to a comparison result, and a second decoder configured to perform error correction on a symbol including the decision data according to the indicator data.

The first decoder may include an iterative decoder configured to iteratively decode the input data and output the iteratively decoded data, and a decision circuit configured to accumulate the iteratively decoded data in bit units, output first data as the decision data when the accumulated value is less than a first reference value among the plurality of reference values, output second data as the decision data when the accumulated value is greater than a second reference value greater than the first reference value among the plurality of reference values, and output third data as the decision data together with the indicator data when the accumulated value is between the first reference value and the second reference value.

The first decoder may further include a switching circuit configured to transmit the iteratively decoded data to the second decoder or the decision circuit in response to a control signal output from the second decoder.

Alternatively, the first decoder may include an iterative decoder configured to output the iteratively decoded data, a demultiplexer connected to an output terminal of the iterative decoder, an accumulator configured to accumulate the iteratively decoded data output from a second output terminal of the demultiplexer in bit units and output the accumulated value, a decision unit configured to output first data as the decision data when the accumulated value is less than a first reference value among the plurality of reference values, output second data as the decision data when the accumulated value is greater than a second reference value greater than the first reference value among the plurality of reference values, and output third data as the decision data when the accumulated value is between the first reference value and the second reference value, and a multiplexer configured to transmit the iteratively decoded data output from a first output terminal of the demultiplexer or the decision data to the second decoder.

The decision unit may transmit the indicator data to the second decoder when the accumulated value is between the first reference value and the second reference value. The decision unit may further output a flag when the accumulated value is between the first reference value and the second reference value. The first decoder may further include an error symbol detector configured to generate the indicator data including position information of the symbol in response to the flag.

The iterative decoder may perform iterative decoding on the input data for a first number of iterations or perform iterative decoding on the input data for a second number more of iterations addition to the first number of iterations in response to a control signal output from the second decoder. When an uncorrectable error exists in the iteratively decoded data output from the first decoder, the second decoder may transmits a control signal to the first decoder to increase a number of iterations performed by the first decoder before the iteratively decoded data is accumulated in bit units, and the first decoder may accumulate the iteratively decoded data in bit units for as many iterations as an increment in response to the control signal.

Features and/or utilities of the present general inventive concept may also be realized by a data processing system including the above-described decoder and a processor configured to process data on which error correction has been performed by the decoder.

Features and/or utilities of the present general inventive concept may also be realized by a controller to control an operation of a hard disk drive. The controller may include a first decoder and a second decoder. The first decoder iteratively decodes input data, accumulates iteratively decoded data in bit units, compares an accumulated value obtained for each bit of the iteratively decoded data with a plurality of reference values, and outputs decision data and indicator data according to a comparison result. The second decoder performs error correction on a symbol including the decision data according to the indicator data.

The first decoder may include an iterative decoder configured to iteratively decode the input data and output the iteratively decoded data and a decision circuit. The decision circuit accumulates the iteratively decoded data in bit units, outputs first data as the decision data when the accumulated value is less than a first reference value among the plurality of reference values, outputs second data as the decision data when the accumulated value is greater than a second reference value greater than the first reference value among the plurality of reference values, and outputs third data as the decision data together with the indicator data when the accumulated value is between the first reference value and the second reference value.

Features and/or utilities of the present general inventive concept may also be realized by a hard disk drive including a disk, a head configured to read an analog signal from the disk, a pre-amplifier configured to amplify the analog signal read by the head, and a controller including a first decoder and a second decoder.

The first decoder iteratively decodes input data corresponding to an analog signal output from the pre-amplifier, accumulates iteratively decoded data in bit units, compares an accumulated value obtained for each bit of the iteratively decoded data with a plurality of reference values, and outputs decision data and indicator data according to a comparison result. The second decoder performs error correction on a symbol including the decision data according to the indicator data.

Features and/or utilities of the present general inventive concept may also be realized by a computer system including the above-described hard disk drive and a host configured to process data on which error correction has been performed by the second decoder included in the hard disk drive.

Features and/or utilities of the present general inventive concept may also be realized by a decoder including a first decoder to receive data and an error signal, to accumulate a plurality of iterations of decoded first data corresponding to the received data when the error signal is received, and to determine a value of the first data based on the accumulated iterations of the decoded first data.

The plurality of iterations may correspond to a first number of iterations, and the first decoder may include an iterative decoder to perform a second number of iterations of decoding data when the error signal is not received and to perform the first number of iterations of decoding the data when the error signal is received, the first number being greater than the second number.

The first decoder may further include a decision circuit to accumulate the iterations of the decoded first data and to determine the value of the first data based on the accumulated iterations.

The decision circuit may include an accumulator to accumulate the iterations of the decoded first data, a decision unit to compare the accumulated first number of iterations of the first data with threshold values to determine the value of the first data.

Threshold values may include an upper threshold value and a lower threshold value, the decision unit outputs a "1" when the accumulated first number of iterations of the first data is above the upper threshold value, the decision unit may output a "0" when the accumulated first number of iterations of the first data is below the lower threshold value, and the decision unit may output a predetermined one of the "1" and the "0", and may output an error flag, when the accumulated first number of iterations of the first data is between the upper and the lower threshold values.

The first decoder may include a switching circuit to output to the decision circuit the first data, and to output from the first decoder corrected data from the decision circuit when the error signal is received and second data from the iterative decoder when the error signal is not received, respectively.

The decoder may include a second decoder to receive decoded data from the first decoder and to perform error correction on the received decoded data.

The second decoder may be a Reed-Solomon error correction code (RS-ECC) decoder.

The error signal may be a control signal to control the first decoder to perform the first number of iterations, and the first decoder may further include an iterative decoder to perform the plurality of iterations of decoding data, a decision circuit to accumulate the plurality of iterations of decoded first data corresponding to the received data, to determine a value of the first data based on the accumulated iterations of the decoded first data, and to output corrected data, and a switching circuit to receive data from the iterative decoder and the decision circuit respectively, and to output data to the decision circuit and the second decoder, respectively. The second decoder may further output the control signal to the switching circuit to control the switching circuit to output the plurality of iterations from the iterative decoder to the decision circuit and to output the corrected data to the second decoder.

Features and/or utilities of the present general inventive concept may also be realized by a decoder including an iterative decoder to receive data and an error signal, and to generate a first number of iterations of decoded first data corresponding to the received data when the error signal is received, and to generate a second number of iterations of decoded second data corresponding to the received data when the error signal is not received, the first number being greater than the second number.

Features and/or utilities of the present general inventive concept may also be realized by a hard disk drive including at least one disk to store data and a controller to control operations to write data to and read data from the at least one disk. The controller may include a decoder to receive data, to detect whether the data includes a predetermined error, to accumulate a plurality of iterations of decoded first data corresponding to the received data having the predetermined error, and to determine a value of the first data based on the accumulated iterations of the decoded first data.

Features and/or utilities of the present general inventive concept may also be realized by a computing device including a hard disk drive including at least one disk to store data and a controller to control operations to write data to and read data from the at least one disk, and a host processor to receive the error corrected data from the hard disk drive to perform at least one operation of the computing device according to the error corrected data.

BRIEF DESCRIPTION OF THE DRAWINGS

The above and other features and advantages of the present general inventive concept will become more apparent by describing in detail exemplary embodiments thereof with reference to the attached drawings in which:

FIG. 3 is a diagram showing the outputs of an iterative decoder and an accumulator which are illustrated in FIG. 2;

DETAILED DESCRIPTION OF THE EMBODIMENTS

Figure 1:
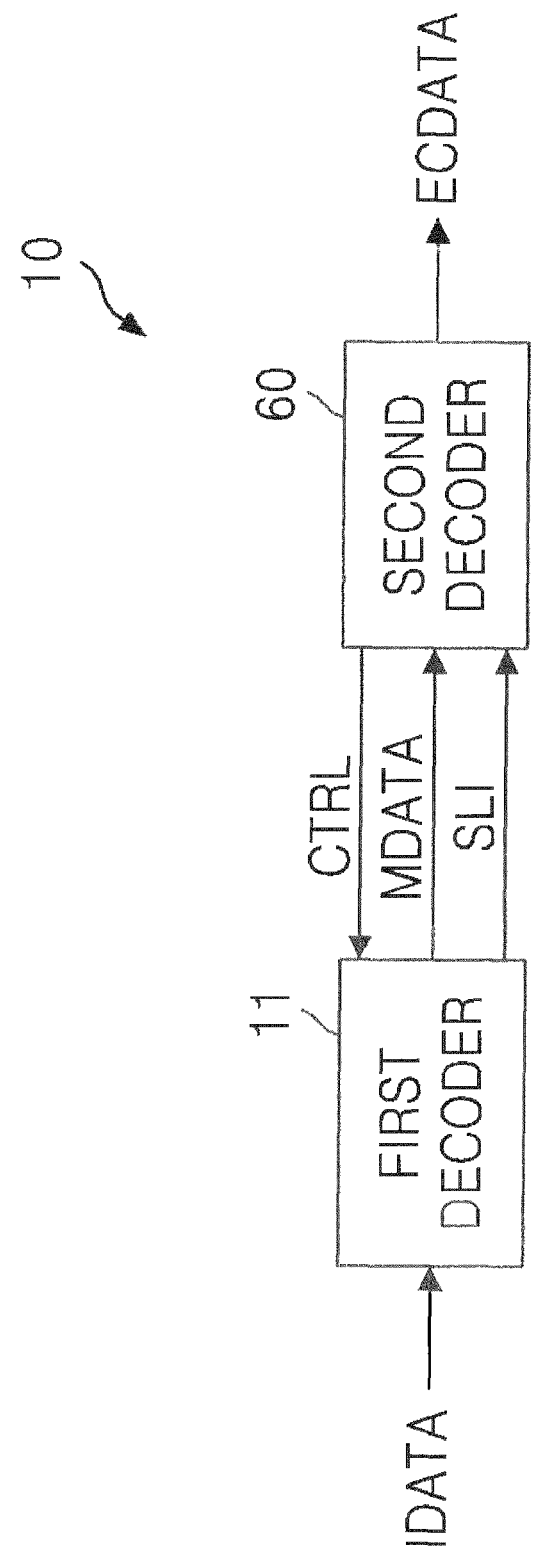
FIG. 1 is a schematic block diagram of a decoder according to some embodiments of the present general inventive concept.

The present general inventive concept now will be described more fully hereinafter with reference to the accompanying drawings, in which embodiments of the general inventive concept are shown. This general inventive concept may, however, be embodied in many different forms and should not be construed as limited to the embodiments set forth herein. Rather, these embodiments are provided so that this disclosure will be thorough and complete, and will fully convey the scope of the general inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms "first," "second," etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the general inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram of a decoder 10 according to an embodiment of the present general inventive concept. The decoder 10 includes a first decoder 11 and a second decoder 60.

During a read operation, the first decoder 11 performs iterative decoding on input data IDATA for a predetermined number of iterations, e.g., K iterations, in addition to a default number of iterations, e.g., [N−1] iterations, in response to a control signal CTRL. The first decoder 11 accumulates decoded data DATA in bit units for the K more iterations, compares the accumulated value of the K iterations with a plurality of reference values, and outputs decision data MDATA and indicator data SLI to the second decoder 60 according to a comparison result. Here, N and K are natural numbers. The first decoder 11 may increase the number of iterations in response to the control signal CTRL output from the second decoder 60. The control signal CTRL may be generated by the second decoder 60 when data MDATA that has undergone iterative decoding for the default number of iterations has an uncorrectable error.

The second decoder 60 performs error correction on the decision data MDATA in units of symbols according to the indicator data SLI and outputs error-corrected data ECDATA. The error-corrected data ECDATA may be transmitted to a data processor or a host.

The decoder 10 may be used in hard disk drives and also used in any types of data processing systems that iteratively decode data and correct or detect errors in the data during a read operation.

Figure 2:
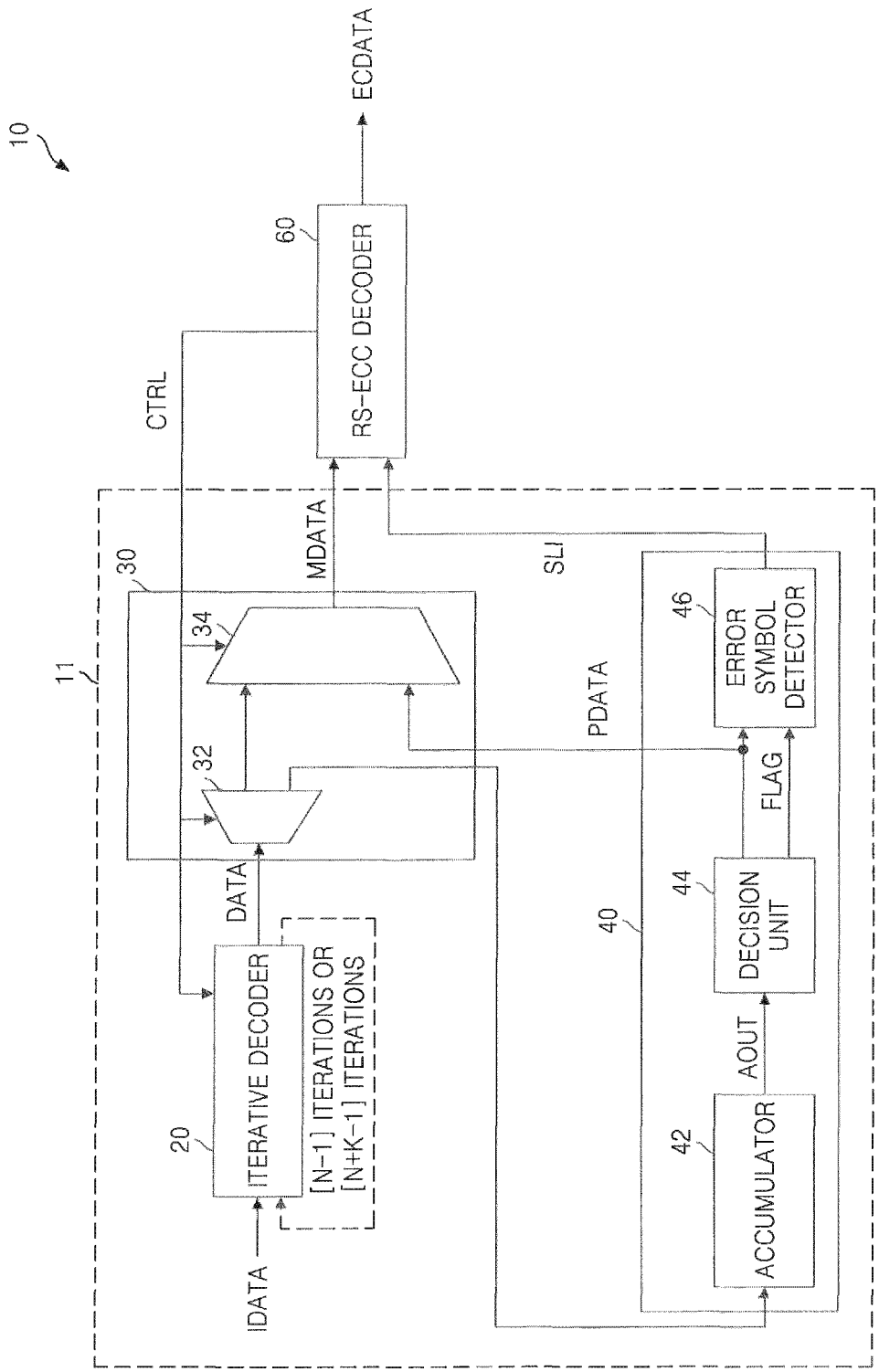
FIG. 2 is a detailed block diagram of the decoder illustrated in FIG. 1.
Figure 4:
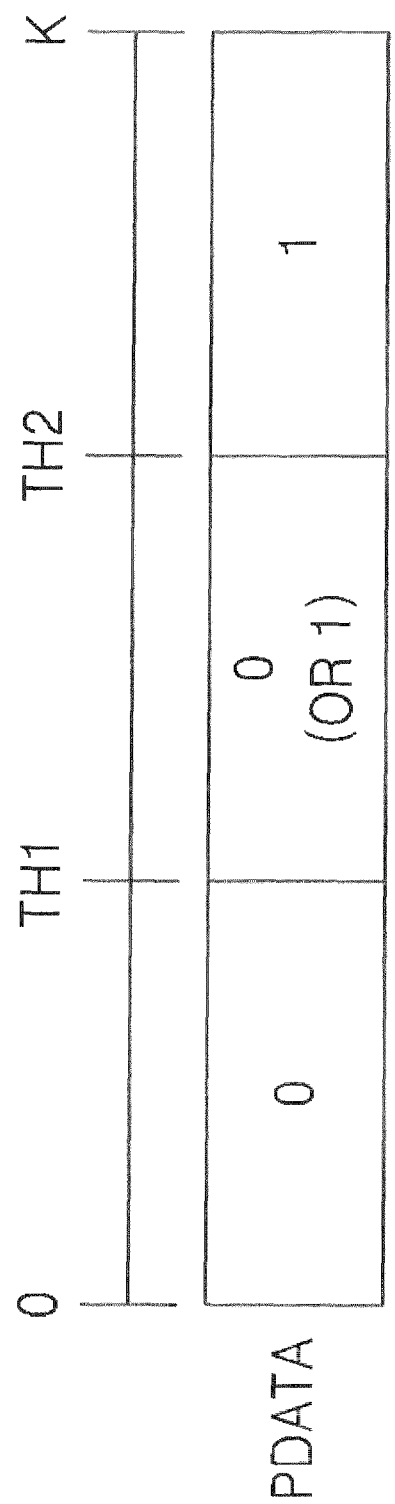
FIG. 4 is a conceptual diagram provided to explain the operation of a decision unit illustrated in FIG. 2.
Figure 5:
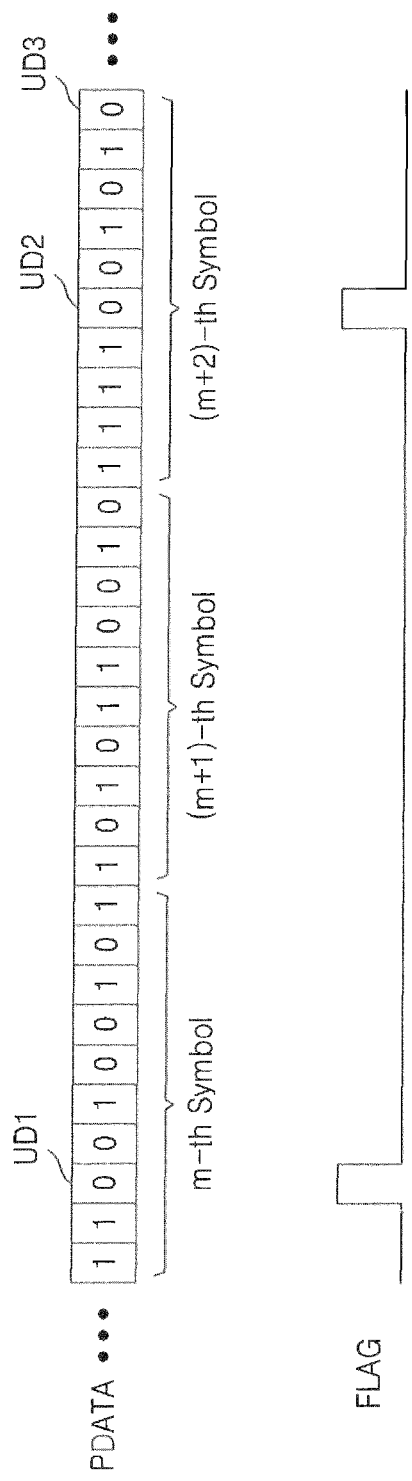
FIG. 5 is a conceptual diagram illustrating output signals of the decision unit illustrated in FIG. 2.
Figure 6:
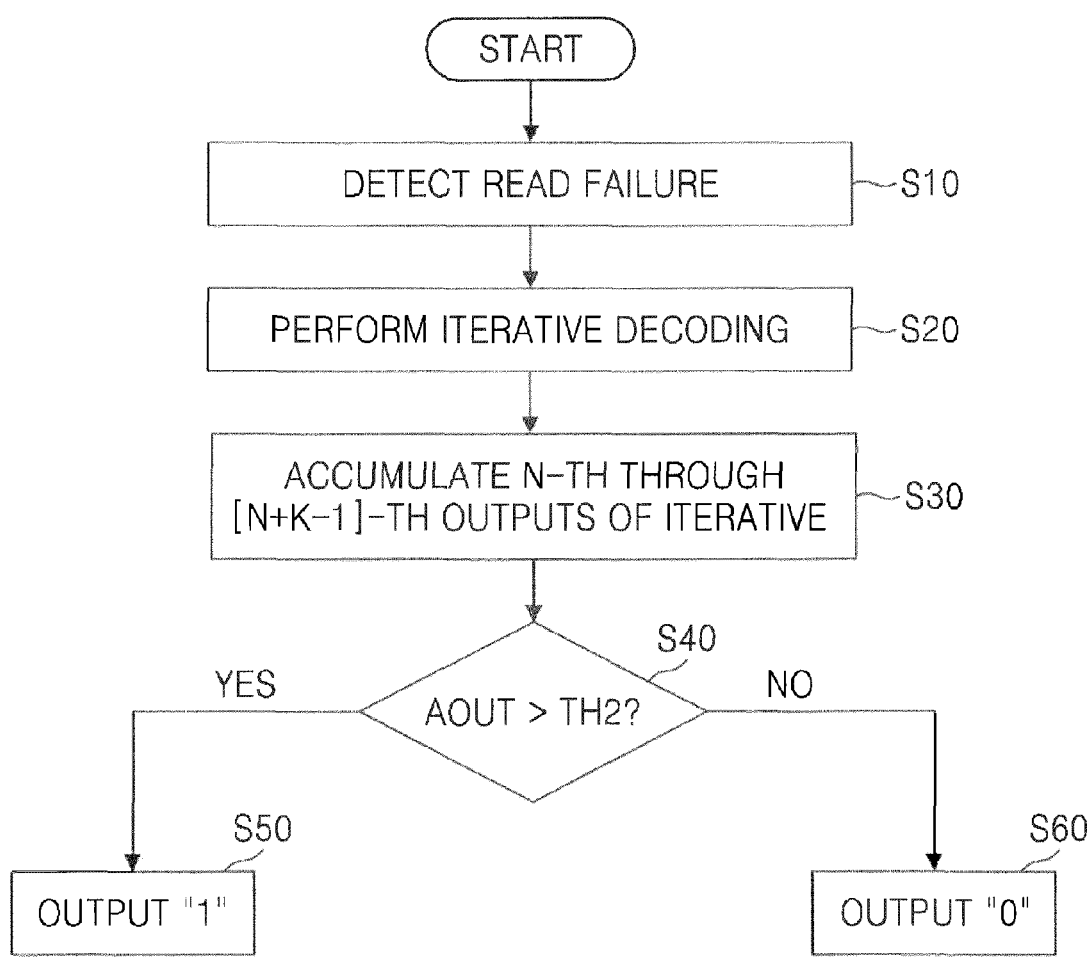
FIG. 6 is a flowchart of the operations of a first decoder illustrated in FIG. 2.

FIG. 2 is a detailed block diagram of the decoder 10 illustrated in FIG. 1. FIG. 3 is a diagram showing the outputs of an iterative decoder 20 and an accumulator 42 which are illustrated in FIG. 2. FIG. 4 is a conceptual diagram provided to explain the operation of a decision unit 44 illustrated in FIG. 2. FIG. 5 is a conceptual diagram illustrating output signals of the decision unit 44 illustrated in FIG. 2. FIG. 6 is a flowchart of the operations of the first decoder 11 illustrated in FIG. 2.

Referring to FIG. 2, the first decoder 11 includes the iterative decoder 20, a switching circuit 30, and a decision circuit 40. The iterative decoder 20 performs iterative decoding on the input data IDATA for the default number of iterations, e.g., [N−1] iterations, or performs the iterative decoding for a predetermined number more of iterations, e.g., K iterations addition to the default number of iterations, that is, for [N+K−1] iterations in response to the control signal CTRL output from the second decoder 60. For instance, the iterative decoder 20 may perform iterative decoding on the input data IDATA for [N−1] iterations in response to the control signal CTRL at a first level, e.g., a low level. On the other hand, when there is an uncorrectable error, the iterative decoder 20 may perform iterative decoding on the input data IDATA for K more iterations, i.e., N-th through [N+K−1]-th iterations addition to the [N−1] iterations in response to the control signal CTRL at a second level, e.g., a high level. In other words, the second decoder 60 may generate the control signal CTRL at the high level when there is an uncorrectable error in the data MDATA that has undergone iterative decoding for [N−1] iterations.

In the present specification and claims, an uncorrectable error refers to an error that is unable to be corrected at least by the second decoder 60 in at least one error-correction process. However, the error may be correctable according to the process and structure of the present general inventive concept in a subsequent error-correction process, as described in further detail below.

The switching circuit 30 transmits the decoded data MDATA output from the iterative decoder 20 to the second decoder 60 in response to the control signal CTRL at the first level. Also, in response to the control signal CTRL at the second level, the switching circuit 30 transmits the decoded data DATA output from the iterative decoder 20 to the decision circuit 40 and transmits the decision data PDATA from the decision circuit 40 to the second decoder 60.

The switching circuit 30 includes a demultiplexer 32 and multiplexer 34. The demultiplexer 32 transmits the decoded data DATA from the iterative decoder 20 to a first input terminal of the multiplexer 34 through a first output terminal in response to the control signal CTRL at the first level. Also, the demultiplexer 32 transmits the decoded data DATA from the iterative decoder 20 to the decision circuit 40 through a second output terminal in response to the control signal CTRL at the second level.

The multiplexer 34 transmits the decoded data DATA from the demultiplexer 32 to the second decoder 60 as selection data MDATA in response to the control signal CTRL at the first level and transmits the decision data PDATA from the decision circuit 40 to the second decoder 60 as the selection data MDATA in response to the control signal CTRL at the second level.

Referring to FIGS. 2 and 6, when read failure occurs due to an uncorrectable error during a read operation, the second decoder 60 generates the control signal CTRL at the second level in operation S10. Accordingly, the iterative decoder 20 performs iterative decoding on the input data IDATA for K more iterations and outputs decoded data DATA to the decision circuit 40 through the demultiplexer 32 K more times in operation S20. The accumulator 42 included in the decision circuit 40 accumulates the decoded data DATA received from the switching circuit 30 in bit units for the K more iterations and outputs an accumulated value AOUT for each bit of the decoded data DATA to the decision unit 44 in operation S30.

As illustrated in FIG. 3, when the iterative decoder 20 outputs data of bit 1 at each of N-th through [N+K−1]-th iterations, i.e., K iterations, the accumulated value AOUT is K. When the iterative decoder 20 outputs data of bit 0 at each of the K iterations, the accumulated value AOUT is 0. When the iterative decoder 20 randomly outputs data of bit 1 and data of bit 0 for the K iterations, the accumulated value AOUT is A, B, or C. Here, A, B, and C are natural numbers between 0 and K.

The accumulator 42 outputs the accumulated value AOUT per bit to the decision unit 44. The decision unit 44 compares the accumulated value AOUT with a plurality of reference values TH1 and TH2 and decides the decision data PDATA according to the comparison result in operation S40.

As illustrated in FIG. 4, when the accumulated value AOUT is less than the first reference value TH1, e.g., "40," among a plurality of reference values (e.g., TH1 and TH2), the decision unit 44 outputs first data, e.g., 0, as the decision data PDATA to the multiplexer 34 in operation S60. When the accumulated value AOUT is greater than the second reference value TH2, e.g., "70," the decision unit 44 outputs second data, e.g., 1, as the decision data PDATA to the multiplexer 34 in operation S50.

When the accumulated value AOUT is between the first reference value TH1 and the second reference value TH2, the decision unit 44 outputs third data, e.g., 1 or 0 set by default, to the multiplexer 34 in operation S60. In addition, the decision circuit 40 outputs a signal SLI to the second decoder 60 to indicate the position of the third data. According to the embodiment illustrated in FIG. 6, the decision unit 44 outputs data of 0 as the third data. The decision data PDATA may be transmitted in bit units to the second decoder 60 through the multiplexer 34.

Referring to FIG. 5, UD1, UD2, and UD3 included in symbols denote the decision data PDATA which is determined to have a value of the third data, e.g., a value of "0", by the decision unit 44. The decision unit 44 may generate a flag when the third data is output as the decision data PDATA. The flag may be generated for each symbol.

The flag generated by the decision unit 44 may be directly transmitted as the indicator data SLI to the second decoder 60. Meanwhile, the multiplexer 34 transmits the decision data PDATA determined per bit by the decision unit 44 to the second decoder 60 as the selection data MDATA. Accordingly, the second decoder 60 can detect a symbol having an error in response to the selection data MDATA received from the multiplexer 34 and the flag received from the decision unit 44.

The second decoder 60 may detect an m-th symbol and an (m+2)-th symbol illustrated in FIG. 5 as having an error, perform error correction on the m-th symbol and the (m+2)-th symbol, and output the error-corrected data ECDATA. The second decoder 60 may perform error correction in symbol units. A Reed-Solomon error correction code (RS-ECC) decoder may be used as the second decoder 60.

The decision circuit 40 may also include an error symbol detector 46. The error symbol detector 46 generates the indicator data SLI indicating the position information of a symbol including the third data in response to the decision data PDATA and the flag, which are output per bit by the decision unit 44, and transmits the indicator data SLI to the second decoder 60. Accordingly, the second decoder 60 may perform error correction on the symbol including the decision data PDATA corresponding to the third data according to the indicator data SLI, i.e., the position information of the erroneous symbol and output the error-corrected data ECDATA.

As described above, the second decoder 60 can detect the position of an error in units of symbols as well as in units of bits. Consequently, the second decoder 60 performs error correction on symbols according to the flag output from the decision unit 44 or the indicator data SLI output from the error symbol detector 46, thereby improving error correction capability, e.g., a bit error rate (BER).

Figure 7:
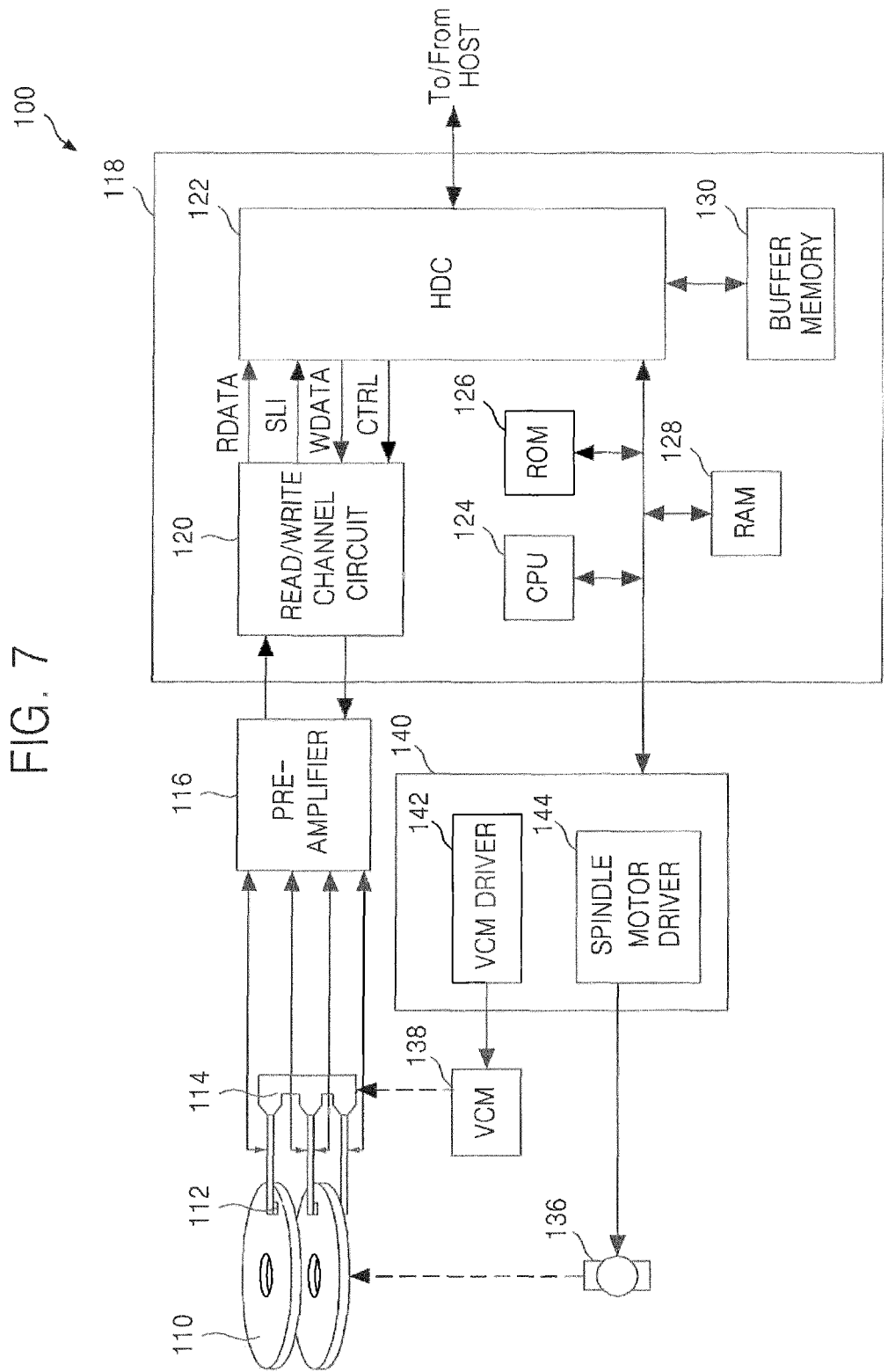
FIG. 7 is a block diagram of a data processing system including the decoder illustrated in FIG. 1.

FIG. 7 is a block diagram of a data processing system 100 including the decoder 10 illustrated in FIG. 1. The decoder 10 described with reference to FIGS. 1 through 6 may be used in a hard disk drive (HDD) which performs a read retry when an error occurs during a read operation. Referring to FIG. 7, the data processing system 100 may be a HDD and includes a plurality of disks 110, a plurality of heads 112, a head assembly 114, a pre-amplifier 116, a main control unit 118, a motor driving unit (or a servo control unit) 140, a spindle motor 136, and a voice coil motor (VCM) 138.

Each of the disks 110 may store data output from a host and is rotated by the spindle motor 136. Each disk 110 may be implemented by a magnetic recording medium. The heads 112 are positioned over the respective disks 110 and perform a read or write operation. The heads 112 are respectively installed at support arms extending toward the respective disks 110 from the head assembly 114 coupled with the VCM 138.

When data is read from one of the disks 110, the pre-amplifier 116 amplifies an analog signal output from one of the heads 112 and outputs an amplified analog signal to a read/write channel circuit 120. When data is written to one of the disks 110, the pre-amplifier 116 transmits a write signal, e.g., a write current, output from the read/write channel circuit 120 to one of the heads 112. Then, the one of the heads 112 writes the write signal to one of the disks 110.

The read/write channel circuit 120 converts an analog signal amplified by the pre-amplifier 116 into a digital signal, iteratively decodes the digital signal, and outputs iteratively decoded data to the hard disk controller (HDC) 122. The first decoder 11 described with reference to FIGS. 1 through 6 may be implemented in the read/write channel circuit 120. Accordingly, the read/write channel circuit 120 may output selection data MDATA and indicator data SLI to the HDC 122.

Under the control of a central processing unit (CPU) 124 or independently, the HDC 22 may perform error correction on the selection data MDATA in symbol units according to the indicator data SLI output from the read/write channel circuit 120 and output error-corrected data ECDATA to the host. In other words, the second decoder 60 described with reference to FIGS. 1 through 6 may be implemented in the HDC 122.

The read/write channel circuit 120 may convert write data output from the HDC 122 into a write signal and output the write signal to the pre-amplifier 116. For instance, when data is written to a disk 110, the HDC 122 is controlled by the CPU 124 to add an ECC to write data output from the host and output the ECC-added write data to the read/write channel circuit 120. Accordingly, the write data output from the host may be written to the disk 110 via the read/write channel circuit 120, the pre-amplifier 116, and one of the heads 112.

When data is read from the disk 110, the HDC 122 is controlled by the CPU 124 to receive read data MDATA that has been iteratively decoded by the read/write channel circuit 120, perform error correction on the iteratively-decoded read data MDATA in symbol units, and transmit error-corrected data ECDATA to the host.

The CPU 124 controlling the operation of the main control unit 118 may read a program code stored in a read-only memory (ROM) 126, e.g., a program code for adjusting the number of decoding iterations, store the program code in a random access memory (RAM) 128, and execute the program code stored in the RAM 128 to control the operation of the HDD 100 or the HDC 122. Accordingly, the CPU 124 may control a method of setting the number of decoding iterations and the read and write operations of the HDD 100.

The CPU 124 may receive a read or write command output from the host and control a spindle motor driver 144 and a VCM driver 142 to control track-seek or track-following according to the received command. In response to at least one control signal output from the HDC 122, the spindle motor driver 144 controls the operation of the spindle motor 136 which controls the rotation of the disks 110. In response to at least one control signal, for example, a control signal for controlling the position of each head 112, output from the HDC 122, the VCM driver 142 generates a driving current for driving the VCM 138 and outputs the driving current to a voice coil of the VCM 138. The VCM 138 moves one of the heads 112 to a position above a track of one of the disks 110 according to the direction and the level of the driving current output from the VCM driver 142.

A buffer memory 130 may be implemented inside or outside the main control unit 118. The buffer memory 130 may temporarily store data transferred between the HDD 100 and the host. The buffer memory 130 may be implemented by a volatile memory such as dynamic RAM (DRAM).

The main control unit 118 including the read/write channel circuit 120, the HDC 122, the CPU 124, the ROM 126, the RAM 128, and the buffer memory 130 may be implemented in a single chip, e.g., a system-on-chip (SoC). The motor driving unit 140 including the spindle motor driver 144 and the VCM driver 142 may also be implemented in a single chip, e.g., SoC.

Figure 8:
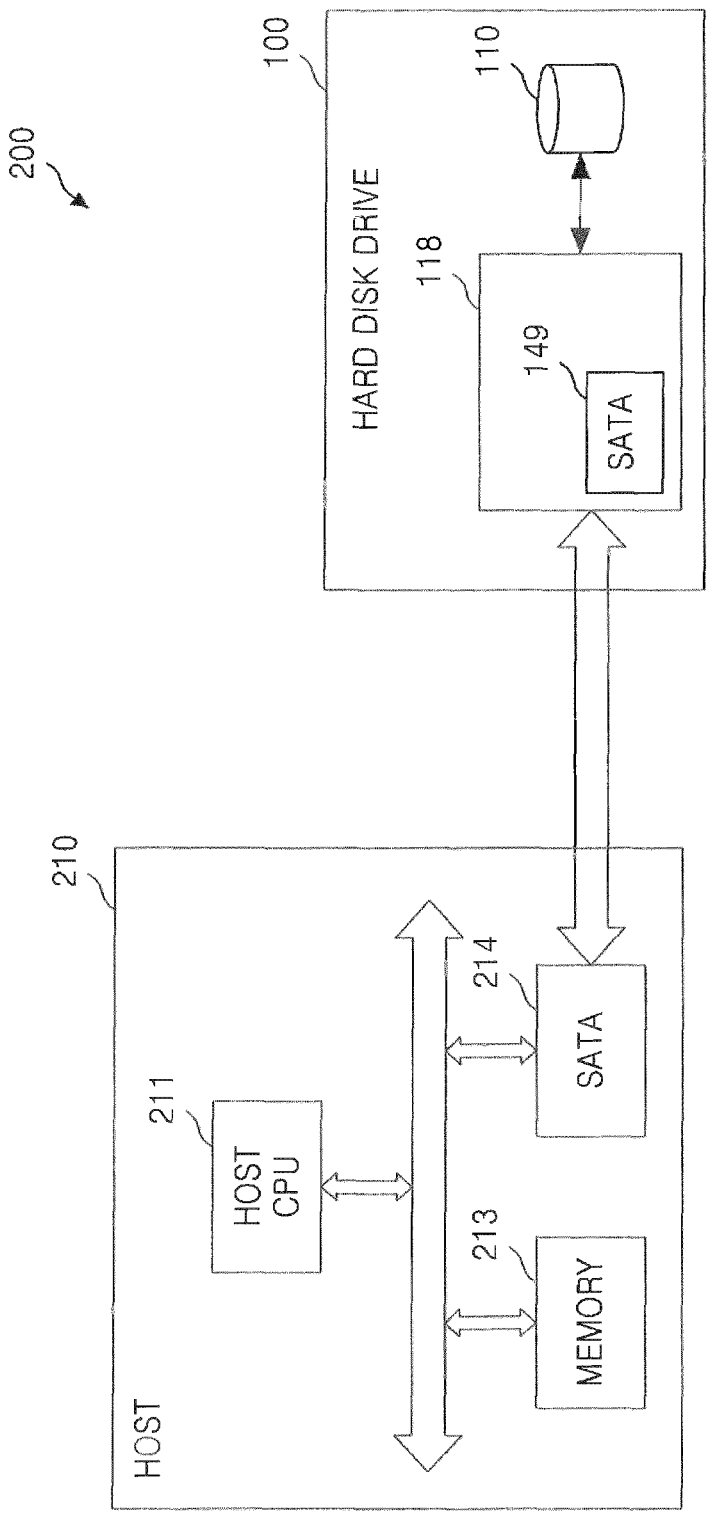
FIG. 8 is a block diagram of a computer system including the data processing system illustrated in FIG. 7.

FIG. 8 is a block diagram of a computer system 200 including the data processing system (or HDD) 100 illustrated in FIG. 7. Referring to FIGS. 1 through 8, the computer system 200 includes the HDD 100 and a host 210 exchanging data with the HDD 100.

The HDD 100 includes a head 112 to read an analog signal from a disk 110, the pre-amplifier 116 to amplify the analog signal read by the head 112, and the main control unit 118. The main control unit 118 includes the first decoder 11, which iteratively decodes the input data IDATA corresponding to an analog signal output from the pre-amplifier 116, accumulates the iteratively decoded data DATA in bit units, compares the accumulated value AOUT with the reference values TH1 and TH2 respectively, and outputs the decision data PDATA and the indicator data SLI or a flag according to the comparison result, and the second decoder 60 which performs error correction on the decision data PDATA in symbol units according to the indicator data SLI or the flag.

The host 210 includes a host CPU 211, a memory 213, and an interface 214, which may be, for example, a SATA interface. The host CPU 211 may control the operation of the host 210 and transmit data from the memory 213 to the interface 149 included in the main control unit 118 of the HDD 100 via the interface 214 of the host 210 during a write operation. The interface 214 and the interface 149 may be implemented by a serial advanced technology attachment (SATA) interface. Accordingly, the interface 214 may receive/transmit data from/to the interface 149 using a SATA protocol.

During a read operation, the interface 214 may be controlled by the host CPU 211 to store data transmitted from the interface 149 included in the main control unit 118 of the HDD 100 in the memory 213. The host CPU 211 may process data stored in the memory 213. For instance, the host CPU 211 may display the data using a display device or output the data using a peripheral device such as a printer connected via a universal serial bus (USB) port.

Figure 9:
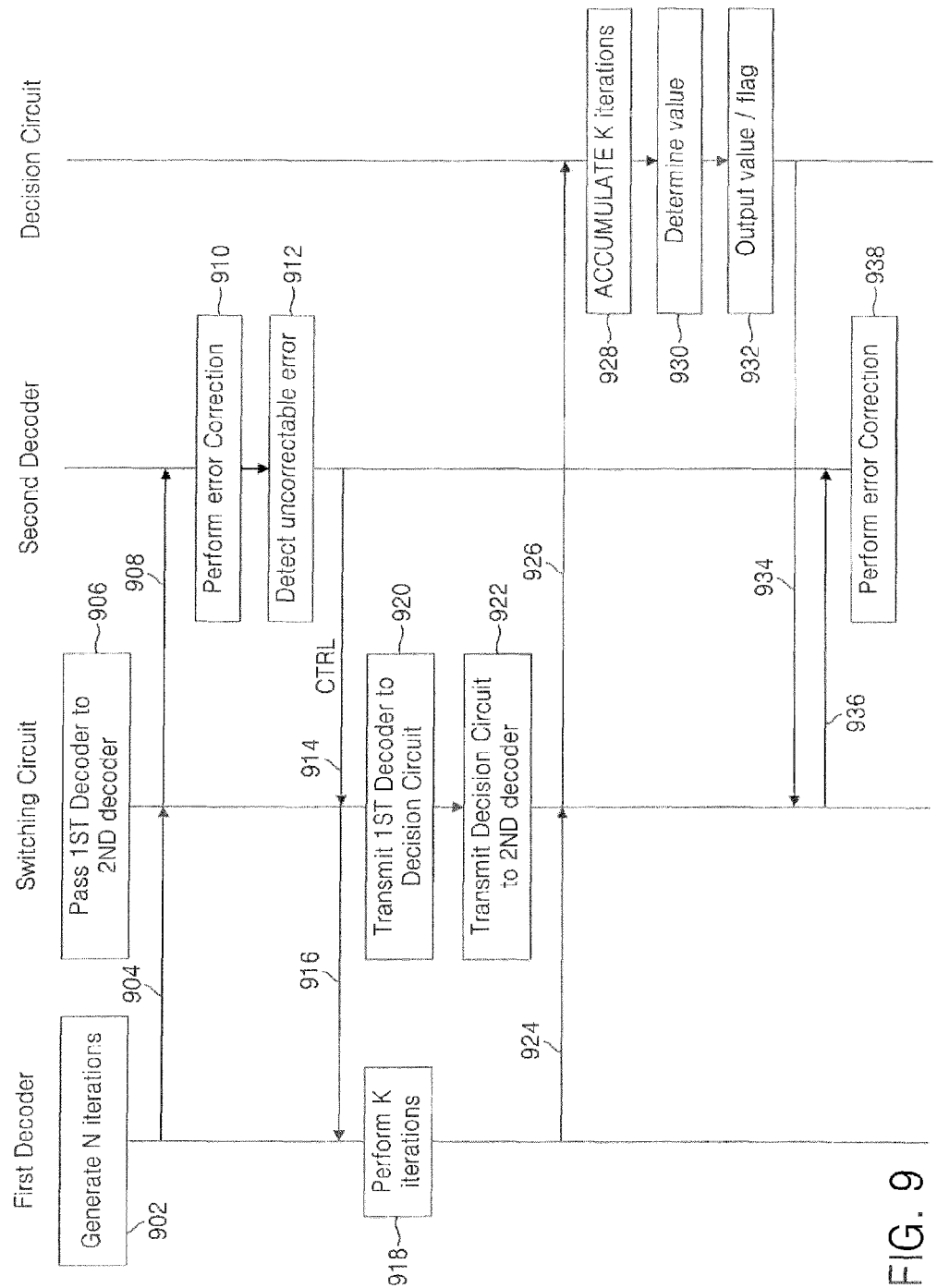
FIG. 9 is a diagram illustrating a decoding operation of the decoder of FIG. 2.

FIG. 9 illustrates an operation of the decoder 10 according to an embodiment of the present general inventive concept. In operation 902, the first decoder, such as the iterative decoder 20, generates N iterations of decoded data. The first decoder transmits the decoded data to the switching circuit, such as the switching circuit 30. The switching circuit is set to pass the decoded data from the first decoder to a second decoder, such as the RS-ECC decoder 60, as illustrated by box 906, and the switching circuit transmits the data in operation 908. The second decoder performs error correction on the decoded data in operation 910 and outputs the error-corrected data. When it is determined that the data includes an error that cannot be corrected in operation 912, the second decoder transmits a control signal to each of the switching circuit and the first decoder in operation 916. The control signal directs the first decoder to perform K iterations of the data. K may be a number greater than N, for example. However, according to embodiments of the present general inventive concept, both N and K may be any number greater than 1, such as 10-100 iterations, etc.

The control signal further controls the switching circuit to transmit the decoded data from the first decoder to a decision circuit, such as the decision circuit 40, and to transmit corrected data, such as PDATA, from the decision circuit to the second decoder, as indicated by boxes 920 and 922, respectively. In operation 924, the first decoder transmits the decoded K iterations to the switching circuit, and the switching circuit transmits the decoded data to the decision circuit in operation 926.

The decision circuit accumulates the K iterations in operation 928 and determines a value of data corresponding to the error signal in operation 930. The decision circuit outputs the corrected data to the switching circuit in operations 932 and 934. When the corrected data includes data having values that could not be determined in operation 930, the decision circuit further outputs an error flag in operation 932. The error flag may be transmitted directly to the second decoder, for example.

In operation 936, the switching circuit transmits the corrected data to the second decoder, and in operation 938, the second decoder again performs error correction on the data. The second decoder may detect the error flag output from the decision circuit and may correct the data corresponding to the error flag.

Figure 10:
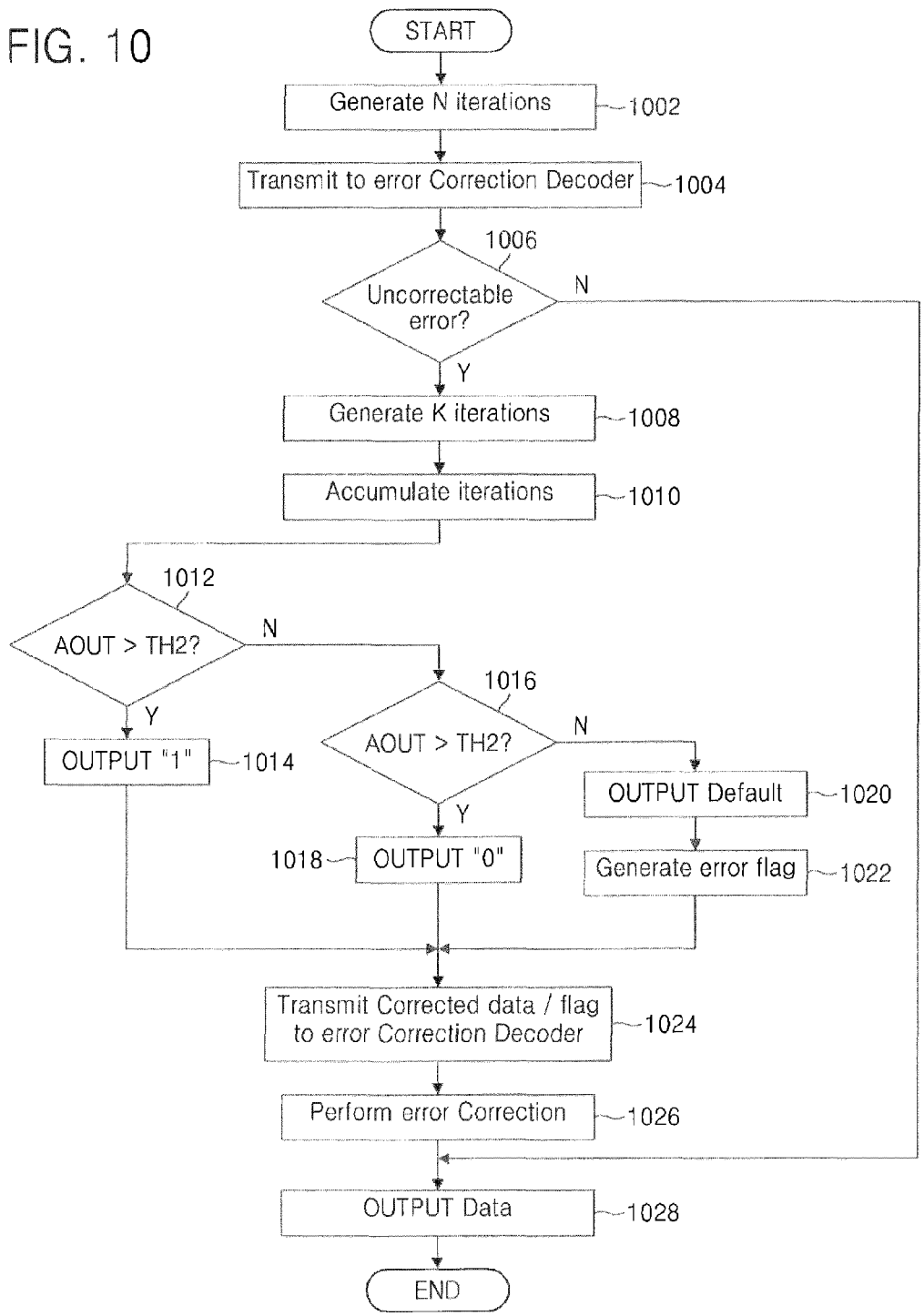
FIG. 10 is a flowchart illustrating a decoding operation.

FIG. 10 illustrates a decoding operation according to the present general inventive concept. In operation 1002, a first decoder, such as the iterative decoder 20, generates N iterations of decoded data corresponding to received input data. In operation 1004, the decoded data is transmitted to an error correction decoder, such as the decoder 60, to perform error correction on the decoded data. If an error is not detected in operation 1006, the error correction decoder outputs the data in operation 1028.

On the other hand, if an error is detected in operation 1006, the error correction decoder may transmit a control signal to the first decoder to generate an additional K iterations in operation 1008 in addition to the N iterations previously generated. The N+K iterations may be accumulated in operation 1010. Alternatively, only the K iterations may be accumulated. According to yet another alternative, the N iterations are accumulated whether or not an error is detected, and a decision based on the N accumulations is generated or output only when the error is detected. According to an embodiment of the present general inventive concept illustrated in FIG. 10, K additional iterations are generated only when an error is detected, and N+K iterations are accumulated only when the error is detected.

The accumulated iterations are compared to one or more predetermined thresholds. In operation 1012, the accumulated value AOut is compared to an upper threshold TH2. If it is determined that the accumulated value is greater than the upper threshold, a "1" is output in operation 1014 to represent the bit that was the subject of the error. In operation 1016, the accumulated value AOut is compared to a lower threshold TH1. If it is determined that the accumulated value is less than the lower threshold, a "0" is output in operation 1018 to represent the bit that was the subject of the error.

On the other hand, if the AOut value is between TH1 and TH2, then a default value may be output in operation 1020. The default value may be either a "1" or a "0" according to predetermined settings. When the default value is generated, an error flag may also be generated in operation 1022 to indicate that the default value may be in error.

Once each bit of a symbol or other segment of data has been determined in operations 1012-1022, a symbol corresponding to the decoded and corrected data may be generated with the determined values and output to the error correction decoder. Alternatively, the data may be transmitted to the error correction decoder bit-by-bit, or in any other segment of data.

The error correction decoder may perform error correction of the corrected data in operation 1026. For example, the error correction decoder may detect the error flag and may perform error correction on the data corresponding to the error flag. The error correction decoder may output the corrected decoded data in operation 1028. According to an alternative embodiment, the error correction decoder may again determine if an uncorrectable error exists in the data and may repeat the process beginning at operation 1006 if the uncorrectable error is again detected.

As described above, a decoder according to some embodiments of the present general inventive concept increases the number of decoding iterations when an error occurs during a read operation, thereby improving a BER.

While the present general inventive concept has been particularly shown and described with reference to exemplary embodiments thereof, it will be understood by those of ordinary skill in the art that various changes in forms and details may be made therein without departing from the spirit and scope of the present general inventive concept as defined by the following claims.

What is claimed is:

1. A decoder comprising:
    a first decoder configured to iteratively decode input data, accumulate iteratively decoded data in bit units, compare an accumulated value obtained for each bit of the iteratively decoded data with a plurality of reference values, and output decision data and indicator data according to a comparison result; and
    a second decoder configured to perform error correction on a symbol comprising the decision data according to the indicator data.

2. The decoder of claim 1, wherein the first decoder comprises:
    an iterative decoder configured to iteratively decode the input data and output the iteratively decoded data; and
    a decision circuit configured to accumulate the iteratively decoded data in bit units, output first data as the decision data when the accumulated value is less than a first reference value among the plurality of reference values, output second data as the decision data when the accumulated value is greater than a second reference value greater than the first reference value among the plurality of reference values, and output third data as the decision data together with the indicator data when the accumulated value is between the first reference value and the second reference value.

3. The decoder of claim 2, wherein the first data has one of values of "1" and "0", the second data has the other of the values of "1" and "0", and the third data has either of the values of "1" and "0" by default.

4. The decoder of claim 2, wherein the first decoder further comprises a switching circuit configured to alternatingly transmit the iteratively decoded data to one of the second decoder and the decision circuit in response to a control signal output from the second decoder.

5. The decoder of claim 1, wherein the first decoder comprises:
    an iterative decoder configured to output the iteratively decoded data;
    a demultiplexer connected to an output terminal of the iterative decoder;
    an accumulator configured to accumulate the iteratively decoded data output from a second output terminal of the demultiplexer in bit units and output the accumulated value;
    a decision unit configured to output first data as the decision data when the accumulated value is less than a first reference value among the plurality of reference values, output second data as the decision data when the accumulated value is greater than a second reference value greater than the first reference value among the plurality of reference values, and output third data as the decision data when the accumulated value is between the first reference value and the second reference value; and
    a multiplexer configured to transmit the iteratively decoded data output from a first output terminal of the demultiplexer or the decision data to the second decoder.

6. The decoder of claim 5, wherein the decision unit transmits the indicator data to the second decoder when the accumulated value is between the first reference value and the second reference value.

7. The decoder of claim 5, wherein the decision unit further outputs a flag when the accumulated value is between the first reference value and the second reference value; and
    wherein the first decoder further comprises an error symbol detector configured to generate the indicator data including position information of the symbol in response to the flag.

8. The decoder of claim 5, wherein the iterative decoder performs iterative decoding on the input data for a first number of iterations or performs iterative decoding on the input data for a second number more of iterations addition to the first number of iterations in response to a control signal output from the second decoder.

9. The decoder of claim 1, wherein when an uncorrectable error exists in the iteratively decoded data output from the first decoder, the second decoder transmits a control signal to the first decoder to increase a number of iterations performed by the first decoder before the iteratively decoded data is accumulated in bit units; and wherein the first decoder accumulates the iteratively decoded data in bit units for a number of iterations corresponding to an increment in response to the control signal.

10. A data processing system comprising:
a decoder comprising:
a first decoder configured to iteratively decode input data, accumulate iteratively decoded data in bit units, compare an accumulated value obtained for each bit of the iteratively decoded data with a plurality of reference values, and output decision data and indicator data according to a comparison result; and
a second decoder configured to perform error correction on a symbol comprising the decision data according to the indicator data; and
a processor configured to process data on which error correction has been performed by the decoder.

11. A controller to control an operation of a hard disk drive, the controller comprising:
a first decoder configured to iteratively decode input data, accumulate iteratively decoded data in bit units, compare an accumulated value obtained for each bit of the iteratively decoded data with a plurality of reference values, and output decision data and indicator data according to a comparison result; and
a second decoder configured to perform error correction on a symbol comprising the decision data according to the indicator data.

12. The controller of claim 11, wherein the first decoder comprises:
an iterative decoder configured to iteratively decode the input data and output the iteratively decoded data; and
a decision circuit configured to accumulate the iteratively decoded data in bit units, output first data as the decision data when the accumulated value is less than a first reference value among the plurality of reference values, output second data as the decision data when the accumulated value is greater than a second reference value greater than the first reference value among the plurality of reference values, and output third data as the decision data together with the indicator data when the accumulated value is between the first reference value and the second reference value.

13. The controller of claim 12, wherein the first decoder further comprises a switching circuit configured to transmit the iteratively decoded data to the second decoder or the decision circuit in response to a control signal output from the second decoder.

14. The controller of claim 11, wherein the first decoder comprises:
an iterative decoder configured to output the iteratively decoded data;
a demultiplexer connected to an output terminal of the iterative decoder;
an accumulator configured to accumulate the iteratively decoded data output from a second output terminal of the demultiplexer in bit units and output the accumulated value;
a decision unit configured to output first data as the decision data when the accumulated value is less than a first reference value among the plurality of reference values, output second data as the decision data when the accumulated value is greater than a second reference value greater than the first reference value among the plurality of reference values, and output third data as the decision data when the accumulated value is between the first reference value and the second reference value; and
a multiplexer configured to transmit the iteratively decoded data output from a first output terminal of the demultiplexer or the decision data to the second decoder.

15. The controller of claim 14, wherein the decision unit transmits the indicator data to the second decoder when the accumulated value is between the first reference value and the second reference value.

16. The controller of claim 11, wherein when an uncorrectable error exists in the iteratively decoded data output from the first decoder, the second decoder transmits a control signal to the first decoder to increase a number of iterations performed by the first decoder before the iteratively decoded data is accumulated in bit units; and wherein the first decoder accumulates the iteratively decoded data in bit units for a number of iterations corresponding to an increment in response to the control signal.

17. A hard disk drive comprising:
a disk;
a head configured to read an analog signal from the disk;
a pre-amplifier configured to amplify the analog signal read by the head; and
a controller comprising a first decoder configured to iteratively decode input data corresponding to an analog signal output from the pre-amplifier, accumulate iteratively decoded data in bit units, compare an accumulated value obtained for each bit of the iteratively decoded data with a plurality of reference values, and output decision data and indicator data according to a comparison result; and a second decoder configured to perform error correction on a symbol comprising the decision data according to the indicator data.

18. The hard disk drive of claim 17, wherein the first decoder comprises:
an iterative decoder configured to iteratively decode the input data and output the iteratively decoded data; and
a decision circuit configured to accumulate the iteratively decoded data in bit units, output first data as the decision data when the accumulated value is less than a first reference value among the plurality of reference values, output second data as the decision data when the accumulated value is greater than a second reference value greater than the first reference value among the plurality of reference values, and output third data as the decision data together with the indicator data when the accumulated value is between the first reference value and the second reference value.

* * * * *